(12) United States Patent
Kim et al.

(10) Patent No.: US 11,308,843 B2
(45) Date of Patent: Apr. 19, 2022

(54) OUTPUT BUFFER CIRCUIT FOR DISPLAY DRIVING APPARATUS

(71) Applicant: Silicon Works Co., Ltd., Daejeon (KR)

(72) Inventors: Young Bok Kim, Daejeon (KR); Taiming Piao, Daejeon (KR); Young Tae Kim, Daejeon (KR); Young Ho Shin, Daejeon (KR)

(73) Assignee: Silicon Works Co., Ltd, Daejeon (KR)

( * ) Notice: Subject to any disclaimer, the term of this patent is extended or adjusted under 35 U.S.C. 154(b) by 0 days.

(21) Appl. No.: 17/368,599

(22) Filed: Jul. 6, 2021

(65) Prior Publication Data
US 2022/0013054 A1    Jan. 13, 2022

(30) Foreign Application Priority Data
Jul. 9, 2020 (KR) .................. 10-2020-0084501

(51) Int. Cl.
*G09G 3/20* (2006.01)
*H03K 3/356* (2006.01)
*H03M 1/66* (2006.01)

(52) U.S. Cl.
CPC .......... *G09G 3/20* (2013.01); *H03K 3/356017* (2013.01); *G09G 2310/0291* (2013.01); *H03M 1/66* (2013.01)

(58) Field of Classification Search
CPC ............ G09G 3/20; G09G 2310/0291; H03K 3/356017; H03M 1/66
See application file for complete search history.

(56) References Cited

U.S. PATENT DOCUMENTS

| 2020/0082781 A1* | 3/2020 | An ........................... G09G 3/20 |
| 2020/0082788 A1* | 3/2020 | Qiu ........................... G09G 5/10 |
| 2020/0082791 A1* | 3/2020 | Petrie .................... G02B 27/017 |
| 2020/0082896 A1* | 3/2020 | Hu ........................ G11C 19/287 |

FOREIGN PATENT DOCUMENTS

KR        10-0857122 B1        9/2008

* cited by examiner

*Primary Examiner* — Sejoon Ahn
(74) *Attorney, Agent, or Firm* — Polsinelli PC

(57) ABSTRACT

Disclosed is an output buffer circuit for a display driving apparatus, which generates an output voltage by using a bias current controlled by digital-to-analog conversion for interpolation data, the output buffer circuit including a decoder configured to output control data obtained by decoding interpolation data, and an output circuit configured to output an output voltage by using a bias current having the amount of current controlled by digital-to-analog conversion for the control data.

15 Claims, 8 Drawing Sheets

Fig. 2

| Input | | | Output | | | | | | | |
|---|---|---|---|---|---|---|---|---|---|---|
| D<2> | D<1> | D<0> | B<7> | B<6> | B<5> | B<4> | B<3> | B<2> | B<1> | B<0> |
| 0 | 0 | 0 | 0 | 0 | 0 | 0 | 0 | 0 | 0 | 1 |
| 0 | 0 | 1 | 0 | 0 | 0 | 0 | 0 | 0 | 1 | 1 |
| 0 | 1 | 0 | 0 | 0 | 0 | 0 | 0 | 1 | 1 | 1 |
| 0 | 1 | 1 | 0 | 0 | 0 | 0 | 1 | 1 | 1 | 1 |
| 1 | 0 | 0 | 0 | 0 | 0 | 1 | 1 | 1 | 1 | 1 |
| 1 | 0 | 1 | 0 | 0 | 1 | 1 | 1 | 1 | 1 | 1 |
| 1 | 1 | 0 | 0 | 1 | 1 | 1 | 1 | 1 | 1 | 1 |
| 1 | 1 | 1 | 1 | 1 | 1 | 1 | 1 | 1 | 1 | 1 |

OUTPUT BUFFER CIRCUIT FOR DISPLAY DRIVING APPARATUS

BACKGROUND

1. Technical Field

The present disclosure relates to a display driving apparatus, and more particularly, to an output buffer circuit for a display driving apparatus, which generates an output voltage by using a bias current controlled by a digital-to-analog conversion for interpolation data.

2. Related Art

A display apparatus includes a display panel for displaying a screen, such as an LCD panel or an LED panel, and a display driving apparatus for driving the display panel.

Among the display panel and the display driving apparatus, the display driving apparatus is fabricated as an integrated circuit and configured to process display data provided from the outside and to provide the display panel with an output voltage corresponding to the display data. The display panel may display a screen in response to the output voltage of the display driving apparatus.

The display driving apparatus may include a digital-to-analog converter (DAC) in order to convert digital data into an analog voltage. The DAC is configured for each channel and occupies a wide area.

In order to reduce a burden of the area attributable to the DAC, an output buffer circuit for outputting the output voltage needs to be designed have the DAC embedded therein.

Accordingly, display data may have voltage selection data having upper bits and interpolation data having lower bits. For example, the voltage selection data and interpolation data may be configured at a ratio of 7:3 in the display data. That is, if the display data has 10 bits, the voltage selection data correspond to seven upper bits, and the interpolation data correspond to three lower bits.

The output buffer circuit may receive a high input voltage and a low input voltage corresponding to a gamma voltage selected by the voltage selection data, and is configured to interpolate a voltage value between the high input voltage and the low input voltage as the interpolation data.

The output buffer circuit is configured to generate a positive current and a negative current by interpolation and to output an output voltage having a level corresponding to a result of comparing the positive current and the negative current, and a feedback current of a fed-back output voltage.

The output buffer circuit performs interpolation for outputting the positive current and the negative current by using a bias current generated by a digital-to-analog conversion for interpolation data. The bias current is provided to have the amount of current that linearly varies in response to a change in the value of the interpolation data.

The output buffer circuit has an offset in an interpolation section. Therefore, the output buffer circuit outputs an output voltage having a waveform non-linearly distorted by the offset in accordance with the linearly varying interpolation data.

The non-linear distortion of the output voltage attributable to the offset acts as a cause to degrade the reliability of the display driving apparatus.

Accordingly, there is a need to develop a display driving apparatus capable of solving the aforementioned problem.

SUMMARY

Various embodiments are directed to providing an output buffer circuit for a display driving apparatus capable of solving an offset by inversely compensating for non-linear distortion attributable to the offset occurring in an interpolation section and outputting an accurate output voltage corresponding to display data.

In an embodiment, an output buffer circuit for a display driving apparatus may include a decoder configured to receive interpolation data and output control data obtained by decoding the interpolation data, an input stage configured to receive a high input voltage, a low input voltage, a feedback output voltage and the control data, output a positive current and a first feedback current in accordance with one of a first input group including the high input voltage and the feedback output voltage and a second input group including the low input voltage and the feedback output voltage, and output a negative current and a second feedback current in accordance with the other of the first input group and the second input group, and an output stage configured to output an output voltage having a level determined by pull-up based on the positive current and the first feedback current and pull-down based on the negative current and the second feedback current. The output voltage corresponds to the feedback output voltage. The input stage controls a bias current so that the bias current has the amount of current non-linearly varying in response to a change in a value of the control data, and outputs the positive current, the first feedback current, the negative current and the second feedback current by using the bias current.

In an embodiment, an output buffer circuit for a display driving apparatus may include a decoder configured to receive interpolation data and output control data obtained by decoding the interpolation data, and an output circuit configured to generate a bias current having the amount of current non-linearly varying in response to a change in a value of the control data by digital-to-analog conversion for the control data, generate a positive current, a first feedback current, a negative current and a second feedback current corresponding to a high input voltage, a low input voltage and a feedback output voltage by using the bias current, and output an output voltage having a level determined by pull-up based on the positive current and the first feedback current and pull-down based on the negative current and the second feedback current. The output voltage corresponds to the feedback output voltage.

The output buffer circuit for a display driving apparatus according to an embodiment converts interpolation data into control data having values for inverse compensations in order to solve an offset, and performs interpolation using a bias current generated by a digital-to-analog conversion for control data.

Therefore, there are effects in that non-linear distortion attributable to an offset occurring in an interpolation section can be inversely compensated for and an accurate output voltage corresponding to display data can be output by solving the offset.

Accordingly, there is an advantage in that the reliability of the output buffer circuit for a display driving apparatus can be improved.

BRIEF DESCRIPTION OF THE DRAWINGS

FIG. 2 is a table illustrating mapping information for decoding interpolation data and control data.

DETAILED DESCRIPTION

An output buffer circuit for a display driving apparatus according to the present disclosure may be described below with reference to FIG. 1.

The display driving apparatus may receive display data including voltage selection data having upper bits and interpolation data having lower bits. For convenience of description, the display data consists of 10 bits, and is illustrated as including the voltage selection data having seven upper bits and the interpolation data having three lower bits.

Figure 1:
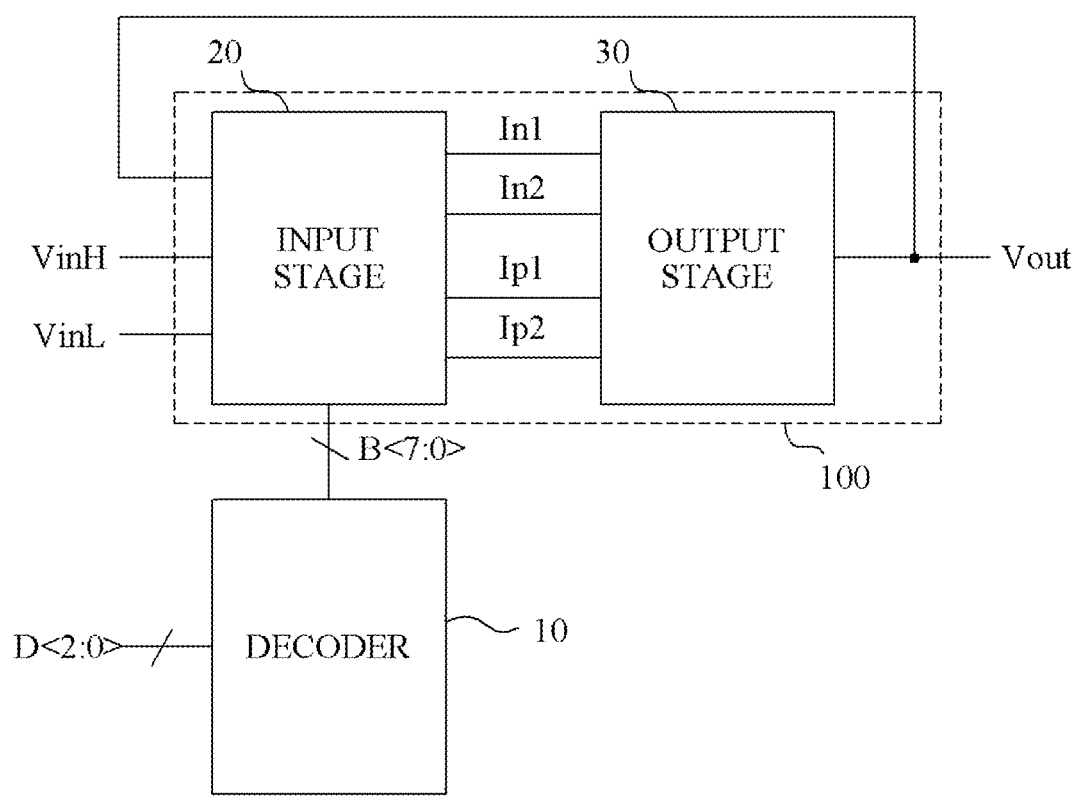
FIG. 1 is a block diagram illustrating an output buffer circuit for a display driving apparatus according to a preferred embodiment of the present disclosure.

Referring to FIG. 1, the output buffer circuit includes a decoder 10 and an output circuit 100.

The decoder 10 is configured to receive interpolation data D<2:0> and to output control data B<7:0> obtained by decoding the interpolation data in order to compensate for an offset.

The decoder 10 is configured to receive the interpolation data D<2:0> that forms lower bits of display data and has values for interpolating a voltage value between a high input voltage VinH and a low input voltage VinL. It may be understood that the interpolation data D<2:0> have three bits as described above.

Furthermore, it may be understood that the control data B<7:0> output by the decoder 10 have values obtained by decoding the interpolation data D<2:0> in order to inversely compensate for an offset occurring in an interpolation section. It may be understood that the control data B<7:0> has the number of bits more extended than that of the interpolation data D<2:0>, that is, eight bits, as described above.

The decoder 10 is configured to output the control data B<7:0> having more bits than the interpolation data D<2:0>, store mapping information in which values of the interpolation data D<2:0> and values of the control data B<7:0> are mapped, and output the control data B<7:0> obtained by decoding the interpolation data D<2:0> by using the mapping information.

The mapping information in which the values of the interpolation data D<2:0>and the values of the control data B<7:0> are mapped may be illustrated as in FIG. 2.

It may be understood that the decoder 10 decodes the interpolation data D<2:0>having three bits into the control data B<7:0> having eight bits by using the mapping information of FIG. 2 as described above.

The output circuit 100 of the output buffer circuit is configured to include an input stage 20 and an output stage 30.

Figure 3:
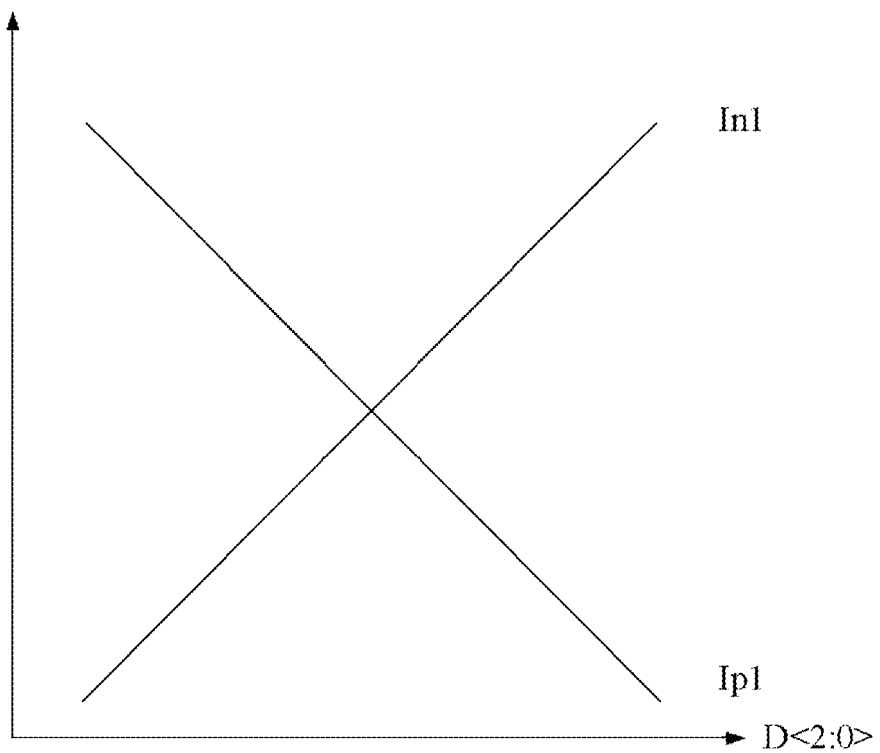
FIG. 3 is a graph illustrating a change in a positive current and a negative current based on values of interpolation data according to the conventional technology.

A case where the output circuit 100 interpolates a voltage value between the high input voltage VinH and the low input voltage VinL by using the interpolation data D<2:0> as in a conventional technology without applying the control data B<7:0> according to the present disclosure may be described with reference to FIGS. 3 and 4.

The input stage 20 may provide a bias current based on digital-to-analog conversion for the interpolation data D<2:0>. In this case, the amount of current of the bias current may linearly vary in response to a change in the values of the interpolation data D<2:0>. Therefore, the input stage 20 of the output circuit 100 may generate a positive current In1 and a negative current Ip1 whose amounts of current linearly vary in response to a change in the values of the interpolation data D<2:0> as in FIG. 3.

Figure 4:
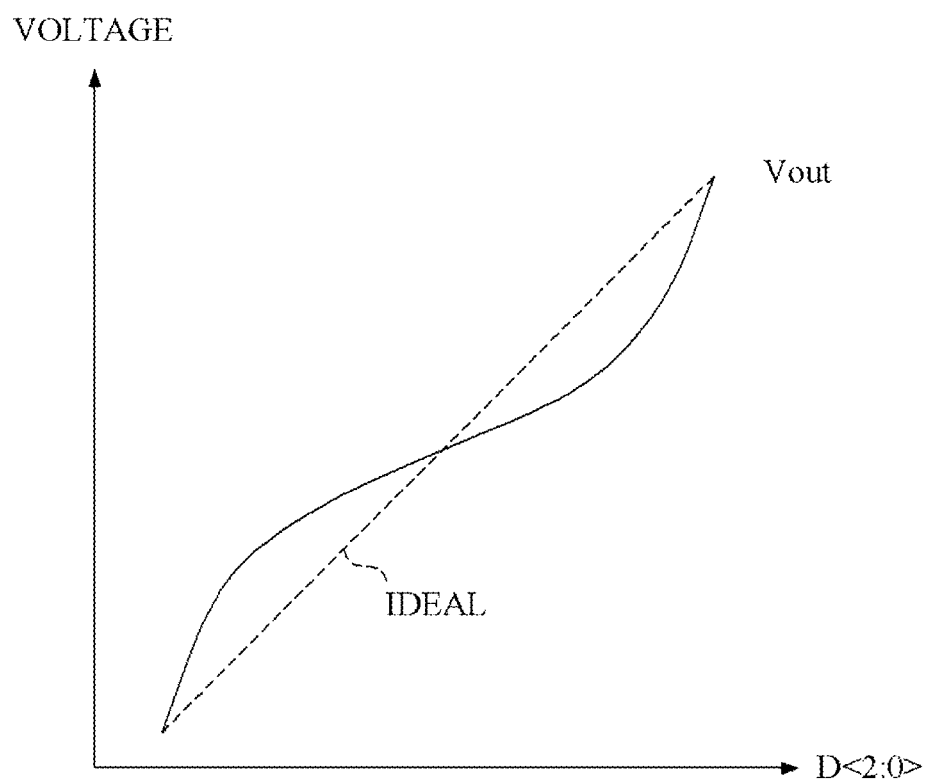
FIG. 4 is a graph illustrating a change in an output voltage based on values of interpolation data according to the conventional technology.

However, the output stage 30 of the output circuit 100 may output an output voltage Vout having a distorted waveform that non-linearly varies as in FIG. 4 due to an offset occurring in an interpolation section.

Figure 5:
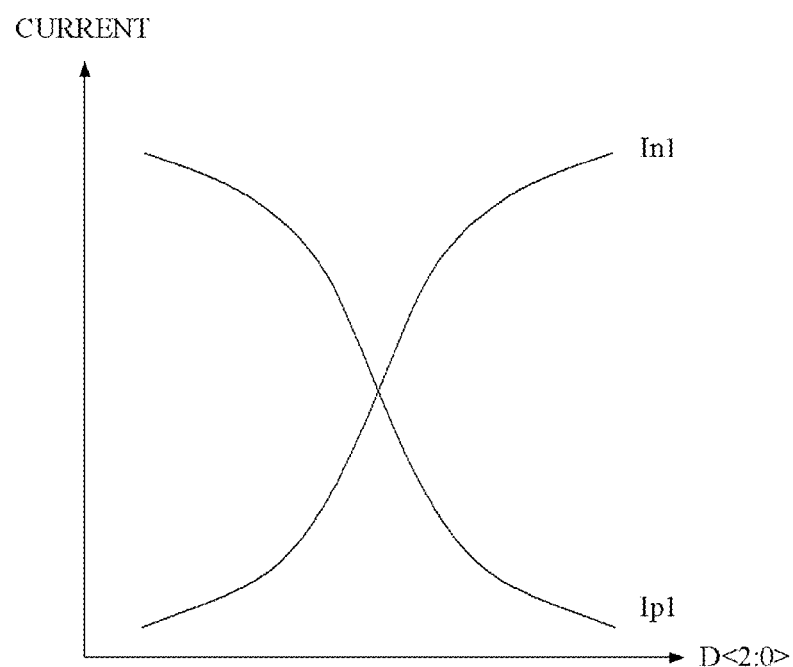
FIG. 5 is a graph illustrating a change in a positive current and a negative current based on values of interpolation data according to the present disclosure.

An embodiment of the present disclosure is configured to use the control data B<7:0> obtained by decoding the interpolation data D<2:0> in order to inversely compensate for the distortion of an output voltage illustrated in FIG. 4, and to non-linearly output the positive current and the negative current in response to a change in the values of the interpolation data D<2:0> by performing digital-to-analog conversion for the control data B<7:0>. A change in the positive current and the negative current based on the values of the interpolation data D<2:0> according to an embodiment of the present disclosure is described with reference to FIG. 5. A change in the output voltage Vout based on the values of the interpolation data D<2:0> is described with reference to FIG. 6.

In the present disclosure, the output circuit 100 generates a bias current having the amount of current controlled by digital-to-analog conversion for the control data B<7:0> obtained by decoding the interpolation data D<2:0> in order to compensate for an offset. The output circuit 100 generates the positive current In1 and a first feedback current In2 and the negative current Ip1 and a second feedback current Ip2 corresponding to the high input voltage VinH, the low input voltage VinL and the fed-back output voltage Vout by using the bias current. Furthermore, the output circuit 100 is configured to pull up the output voltage Vout by the positive current In1 and the first feedback current In2 or to pull down the output voltage Vout by the negative current Ip1 and the second feedback current Ip2.

In the output circuit 100, the bias current is generated to have the amount of current that non-linearly varies in response to a change in the interpolation data D<2:0>, that is, a change in the control data B<7:0>, as will be described later with reference to FIGS. 7 and 8. Therefore, the output circuit 100 may generate the positive current In1 and the negative current Ip1 each having a non-linear change as in FIG. 5, due to the bias current having the amount of current that non-linearly varies.

That is, it may be understood that the positive current In1 and negative current Ip1 generated by the output circuit 100 according to the present disclosure have been previously inversely compensated for by considering an offset to be applied to generate the output voltage Vout.

Figure 6:
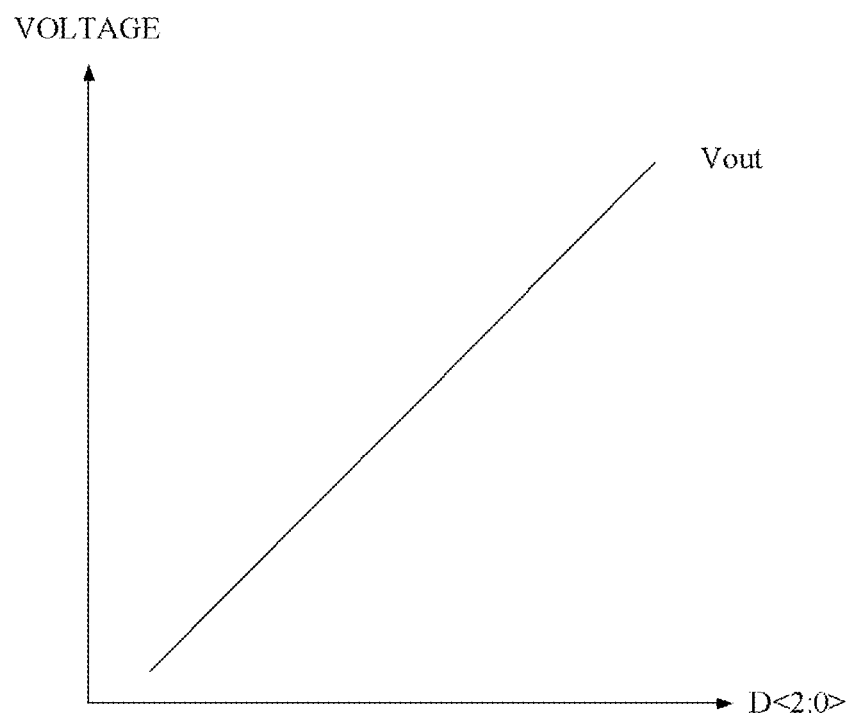
FIG. 6 is a graph illustrating a change in an output voltage based on values of interpolation data according to the present disclosure.

As a result, the output circuit 100 may output the output voltage Vout that linearly varies in response to a change in the interpolation data D<2:0> as in FIG. 6 because an offset occurring in an interpolation section is compensated for by the inverse compensations.

The output circuit 100 is configured to include an embedded digital-to-analog converter (DAC) for performing digital-to-analog conversion for the control data B<7:0> in order to reduce a burden of the area of a display driving apparatus attributable to the DAC. It may be understood that the embedded DAC consists of current sources of the input stage 20 and a plurality of switching circuits. The embedded DAC will be described in detail later.

In the output circuit 100, the input stage 20 is configured to receive the high input voltage VinH, the low input voltage VinL, a fed-back output voltage Vout and the control data B<7:0>, to output the positive current In1 and the first feedback current In2 in accordance with one of a first input group, including the high input voltage VinH and the fed-back output voltage Vout, and a second input group, including the low input voltage VinL and the fed-back output voltage Vout, and to output the negative current Ip1 and the second feedback current Ip2 in accordance with the other of the first input group and the second input group.

Furthermore, the output stage 30 is configured to output the output voltage Vout having a level determined by pull-up based on the positive current In1 and the first feedback current In2 and pull-down based on the negative current Ip1 and the second feedback current Ip2.

In this case, the input stage 20 is configured to control a bias current so that the bias current has the amount of current corresponding to the control data B<7:0> in order to compensate for an offset, and to output the positive current In1, the first feedback current In2, the negative current Ip1 and the second feedback current Ip2 by using the bias current.

Figure 7:
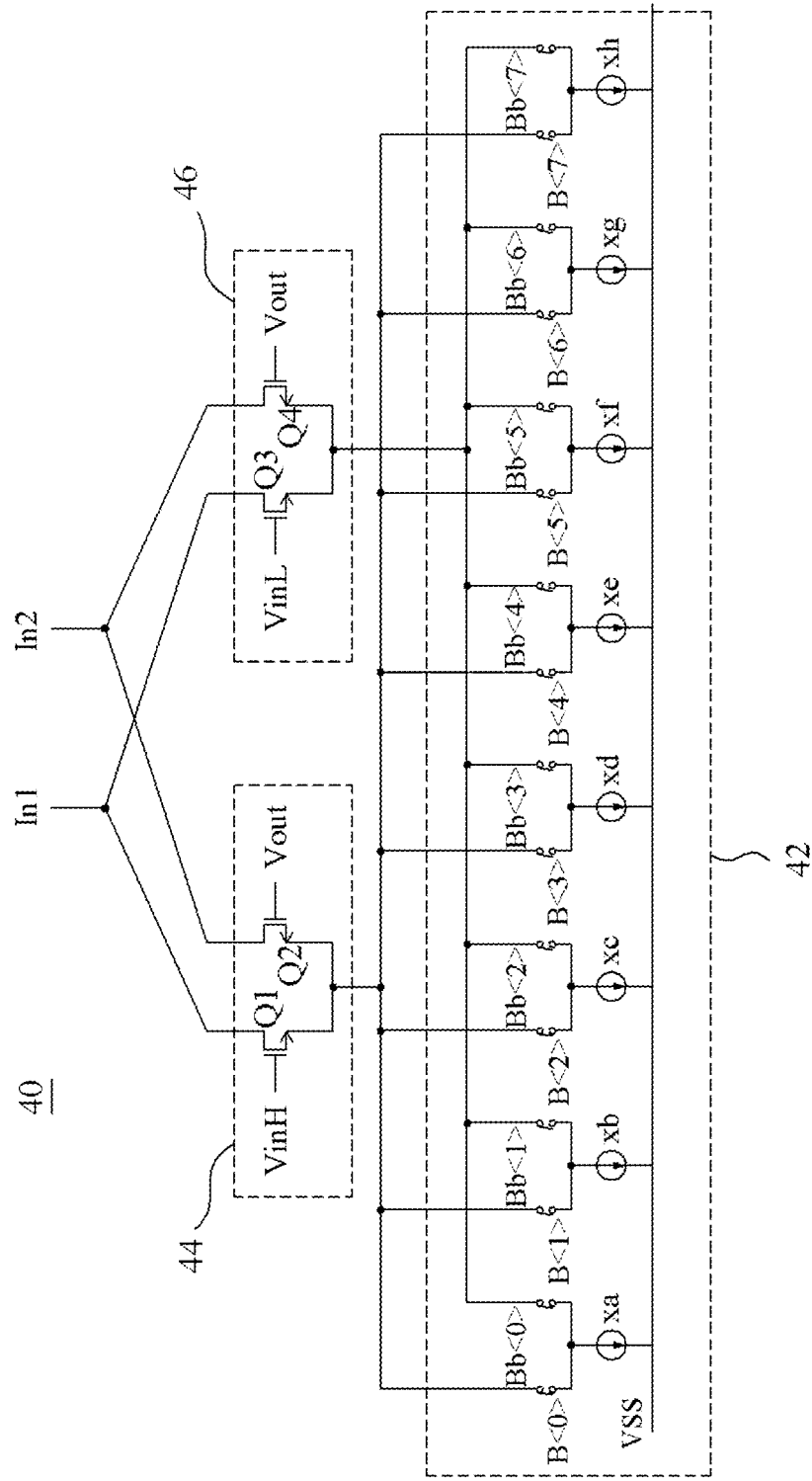
FIG. 7 is a detailed circuit diagram illustrating a positive circuit of an input stage.
Figure 8:
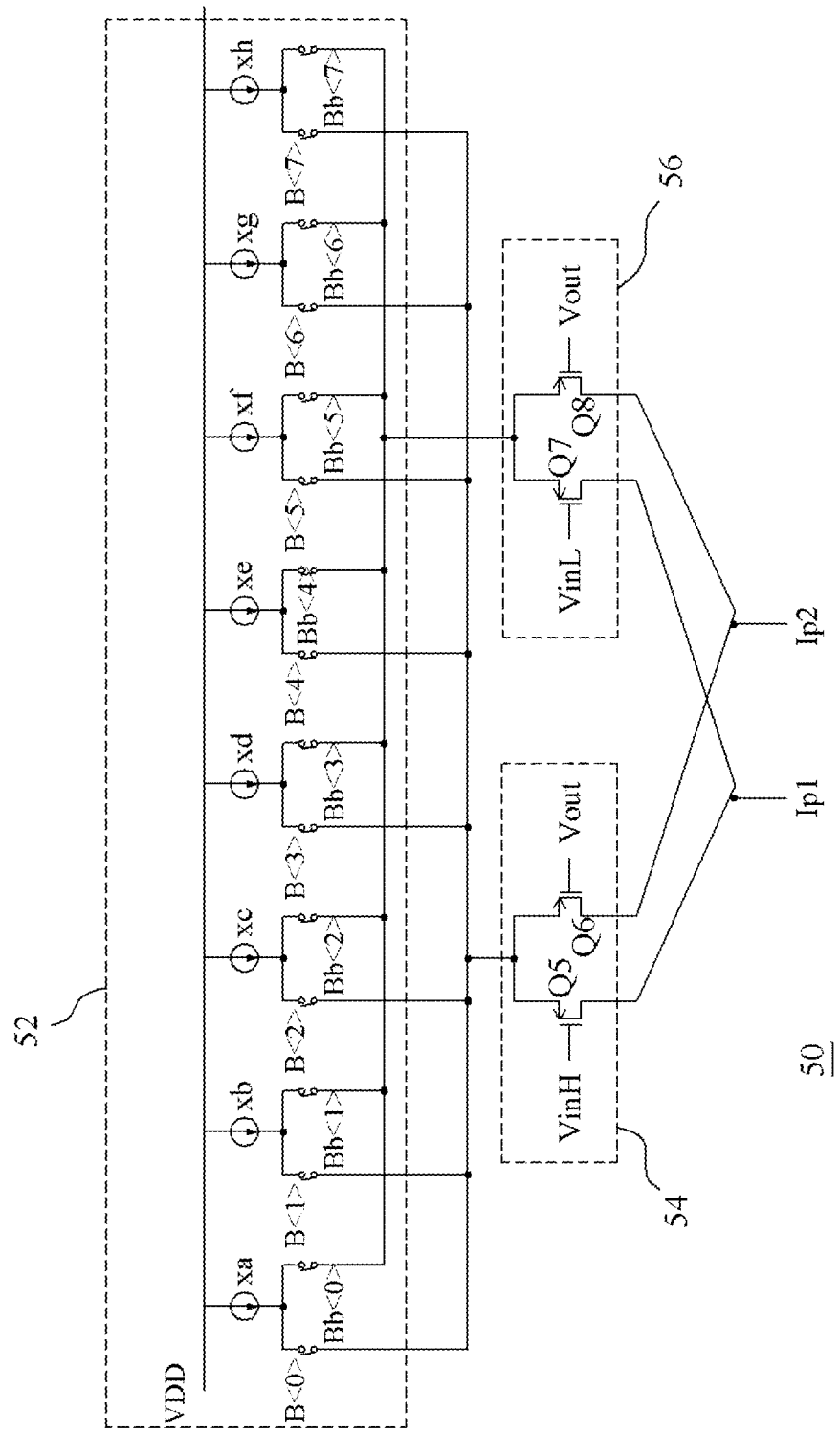
FIG. 8 is a detailed circuit diagram illustrating a negative circuit of the input stage.

The input stage 20 is configured to include a positive circuit 40 of FIG. 7 and a negative circuit 50 of FIG. 8.

The positive circuit 40 is configured to control a positive bias current so that the positive bias current has the amount of current corresponding to the control data B<7:0>, and to output the positive current In1 and the first feedback current In2 corresponding to one of the first input group, including the high input voltage VinH and the fed-back output voltage Vout, and the second input group, including the low input voltage VinL and the fed-back output voltage Vout, by using the positive bias current.

Furthermore, the negative circuit 50 is configured to control a negative bias current so that the negative bias current has the amount of current corresponding to the control data B<7:0>, and to output the negative current Ip1 and the second feedback current Ip2 in accordance with the other of the first input group, including the high input voltage VinH and the fed-back output voltage Vout, and the second input group, including the low input voltage VinL and the fed-back output voltage Vout, by using the negative bias current.

In this case, the positive circuit 40 is configured to include a first current supply circuit 42, a first bias unit 44 and a second bias unit 46.

The first current supply circuit 42 is configured to provide a first positive bias current having the amount of current corresponding to non-inverted control data B<7:0> and a second positive bias current having the amount of current corresponding to inverted control data B<7:0>.

More specifically, the first current supply circuit 42 includes a plurality of first current sources xa to xh, a first switching circuit and a second switching circuit.

The plurality of first current sources xa to xh is connected to a ground voltage VSS in common, set to have the same or different amounts of current, and configured in parallel to the ground voltage VSS. It is preferred that the plurality of first current sources xa to xh be configured to have the same or different current amplification ratios. For example, the plurality of first current sources xa to xh may be set such that the current sources having a plurality of current amplification ratios, such as 0.5, 1.1, and 1.5, are mixed.

The first switching circuit includes a plurality of first switches configured to correspond to bits of the non-inverted control data B<7:0>, respectively. The plurality of first switches may be divided into B<0>, B<1>, . . . , B<7> corresponding to bits of the control data B<7:0>, respectively. The plurality of first switches B<0>, B<1>, . . . , B<7> is connected to the plurality of first current sources xa to xh in a one-to-one way.

The plurality of first switches B<0>, B<1>, . . . , B<7> is switched in response to values of the bits of the non-inverted control data B<7:0>, respectively, connected to the first bias unit 44 in common, and configured to provide the first bias unit 44 with the first positive bias current having values of bias currents that flow through a turned-on path and that are added at a common node.

The second switching circuit includes a plurality of second switches configured to correspond to bits of the inverted control data B<7:0>, respectively. The plurality of second switches may be divided into Bb<0>, Bb<1>. . . , Bb<7> corresponding to bits of the control data B<7:0>, respectively. The plurality of second switches Bb<0>, Bb<1>, . . . , Bb<7> is connected to the plurality of first current sources xa to xh in a one-to-one way.

The plurality of second switches Bb<0>, Bb<1>, . . . , Bb<7> is switched in response to values of the bits of the inverted control data B<7:0>, respectively, connected to the second bias unit 46 in common, and configured to provide the second bias unit 46 with the second positive bias current having values of bias currents that flow through a turned-on path and that are added at a common node.

In this case, inverted values and non-inverted values of the control data B<7:0> are complementarily formed. Therefore, the first positive bias current and the second positive bias current may also complementarily vary in a way to correspond to the inverted values and non-inverted values of the control data B<7:0>.

The first positive bias current and second positive bias current of the first current supply circuit 42 are generated by digital-to-analog conversion for the control data B<7:0>. The bias currents, that is, the first positive bias current and the second positive bias current, are generated to have the amount of current based on a current amplification ratio of the plurality of first current sources xa to xh, which is non-linearly set in response to a change in the control data B<7:0>.

The first positive bias current and the second positive bias current each having the amount of current that non-linearly varies are provided to the first bias unit 44 and the second bias unit 46, respectively. As a result, as in FIG. 5, the first positive bias current and the second positive bias current may contribute to generating the positive current In1 and the negative current Ip1 each having a non-linear change.

The first bias unit 44 includes an NMOS transistor Q1 having a gate to which the high input voltage VinH is applied and an NMOS transistor Q2 having a gate to which the fed-back output voltage Vout is applied. The NMOS transistor Q1 and the NMOS transistor Q2 have their sources connected in common, and are configured to receive the first positive bias current from the plurality of first switches B<0>, B<1>, . . . , B<7> through the sources connected in common.

According to the aforementioned construction, the first bias unit 44 provides the positive current In1 corresponding to the high input voltage VinH by using the first positive bias current provided by the plurality of first switches B<0>, B<1>, . . . , B<7>through the NMOS transistor Q1, and provides the first feedback current In2 corresponding to the fed-back output voltage Vout by using the first positive bias current provided by the plurality of first switches B<0>, B<1>, . . . , B<7> through the NMOS transistor Q2. Furthermore, the second bias unit 46 includes an NMOS transistor Q3 having a gate to which the low input voltage VinL is applied and an NMOS transistor Q4 having a gate to which the fed-back output voltage Vout is applied. The NMOS transistor Q3 and the NMOS transistor Q4 have their sources connected in common, and are configured to receive the second positive bias current from the plurality of second switches Bb<0>, Bb<1>, . . . , Bb<7> through the sources connected in common.

According to the aforementioned construction, the second bias unit 46 provides the positive current In1 corresponding to the low input voltage VinL by using the second positive bias current provided by the plurality of second switches Bb<0>, Bb<1>, . . . , Bb<7> through the NMOS transistor Q3, and provides the first feedback current In2 corresponding to the fed-back output voltage Vout by using the second positive bias current provided by the plurality of second switches Bb<0>, Bb<1>, . . . , Bb<7> through the NMOS transistor Q4.

The negative circuit 50 is configured to include a second current supply circuit 52, a third bias unit 54 and a fourth bias unit 56.

The second current supply circuit 52 is configured to provide a first negative bias current having the amount of current corresponding to the non-inverted control data B<7:0> and a second negative bias current having the amount of current corresponding to the inverted control data B<7:0>.

More specifically, the second current supply circuit 52 includes a plurality of second current sources xa to xh, a third switching circuit and a fourth switching circuit.

The plurality of second current sources xa to xh is connected to an operating voltage VDD in common, set to have the same or different amounts of current, and configured in parallel to the operating voltage VDD. It is preferred that the plurality of second current sources xa to xh be configured to have the same or different current amplification ratios. For example, the plurality of second current sources xa to xh may be set such that the current sources having a plurality of current amplification ratios, such as 0.5, 1.1, and 1.5, are mixed. It is preferred that the first current supply circuit 42 and the second current supply circuit 52 be configured to have current amplification ratios having the same sequence in accordance with the control data B<7:0>.

The third switching circuit includes a plurality of third switches configured to correspond to bits of the non-inverted control data B<7:0>, respectively. The plurality of third switches may be divided into B<0>, B<1>, . . . , B<7> corresponding to bits of the control data B<7:0>, respectively. The plurality of third switches B<0>, B<1>, . . . , B<7> is connected to the plurality of second current sources xa to xh in a one-to-one way.

The plurality of third switches B<0>, B<1>, . . . , B<7> is switched in response to values of the bits of the non-inverted control data B<7:0>, respectively, connected to the third bias unit 54 in common, and configured to provide the third bias unit 54 with the first negative bias current having values of bias currents that flow through a turned-on path and that are added at a common node.

The fourth switching circuit includes a plurality of fourth switches configured to correspond to bits of the inverted control data B<7:0>, respectively. The plurality of fourth switches may be divided into Bb<0>, Bb<1>, . . . , Bb<7> in accordance with bits of the control data B<7:0>, respectively. The plurality of fourth switches Bb<0>, Bb<1>, . . . , Bb<7> is connected the plurality of second current sources xa to xh in a one-to-one way.

The plurality of fourth switches Bb<0>, Bb<1>, . . . , Bb<7> is switched in response to values of the bits of the inverted control data B<7:0>, respectively, connected to the fourth bias unit 56 in common, and configured to provide the fourth bias unit 56 with the second negative bias current having value of bias currents that flow through a turned-on path and that are added at a common node.

In this case, inverted values and non-inverted values of the control data B<7:0>are complementarily formed. Therefore, the first negative bias current and the second negative bias current may also complementarily vary in a way to correspond to the inverted values and non-inverted values of the control data B<7:0>.

The first negative bias current and second negative bias current of the second current supply circuit 52 are generated by digital-to-analog conversion for the control data B<7:0>. The bias currents, that is, the first negative bias current and the second negative bias current, are generated to have the amount of current based on a current amplification ratio of the plurality of second current sources xa to xh, which is non-linearly set in response to a change in the control data B<7:0>.

The first negative bias current and the second negative bias current each having the amount of current that non-linearly varies are provided to the third bias unit 54 and the fourth bias unit 56, respectively. As a result, as in FIG. 5, the first negative bias current and the second negative bias current may contribute to generating the positive current In1 and the negative current Ip1 each having a non-linear change.

The third bias unit 54 includes a PMOS transistor Q5 having a gate to which the high input voltage VinH is applied and a PMOS transistor Q6 having a gate to which the fed-back output voltage Vout is applied. The PMOS transistor Q5 and the PMOS transistor Q6 have their sources connected in common, and are configured to receive the first negative bias current from the plurality of third switches B<0>, B<1>, . . . , B<7>through the sources connected in common.

According to the aforementioned construction, the third bias unit 54 provides the negative current Ip1 corresponding to the high input voltage VinH by using the first negative bias current provided by the plurality of third switches B<0>, B<1>, . . . , B<7>through the PMOS transistor Q5, and provides the second feedback current Ip2 corresponding to the fed-back output voltage Vout by using the first negative bias current provided by the plurality of third switches B<0>, B<1>, . . . , B<7> through the PMOS transistor Q6.

Furthermore, the fourth bias unit 56 includes a PMOS transistor Q7 having a gate to which the low input voltage VinL is applied and a PMOS transistor Q8 having a gate to which the fed-back output voltage Vout is applied. The PMOS transistor Q7 and the PMOS transistor Q8 have their source connected in common, and are configured to receive the second negative bias current from the plurality of fourth switches Bb<0>, Bb<1>, . . . , Bb<7> through the sources connected in common.

According to the aforementioned construction, the fourth bias unit 56 provides the negative current Ip1 corresponding to the low input voltage VinL by using the second negative bias current provided by the plurality of fourth switches Bb<0>, Bb<1>, . . . , Bb<7> through the PMOS transistor Q7, and provides the second feedback current Ip2 corresponding to the fed-back output voltage Vout by using the second negative bias current provided by the plurality of fourth switches Bb<0>, Bb<1>, . . . , Bb<7> through the PMOS transistor Q8.

The output stage 30 may receive the positive current In1, the first feedback current In2, the negative current Ip1 and the second feedback current Ip2 from the input stage 20 configured as described above, may perform pull-up based on the positive current In1 and the first feedback current In2 and pull-down based on the negative current Ip1 and the second feedback current Ip2, and may output the output voltage Vout having a level determined by the pull-up and the pull-down.

The output buffer circuit for a display driving apparatus configured as described above according to the present disclosure converts interpolation data into control data having an increased number of bits in order to solve an offset, and performs interpolation by using a bias current generated to have a current value for inverse compensations by digital-to-analog conversion for the control data.

Accordingly, according to the present disclosure, the non-linear distortion of an output voltage attributable to an offset occurring in an interpolation section can be inversely compensated for, and an accurate output voltage corresponding to display data can be output by solving the offset.

What is claimed is:

1. An output buffer circuit for a display driving apparatus, comprising:
   a decoder configured to receive interpolation data and output control data obtained by decoding the interpolation data;
   an input stage configured to receive a high input voltage, a low input voltage, a feedback output voltage and the control data, output a positive current and a first feedback current in accordance with one of a first input group comprising the high input voltage and the feedback output voltage and a second input group comprising the low input voltage and the feedback output voltage, and output a negative current and a second feedback current in accordance with the other of the first input group and the second input group; and
   an output stage configured to output an output voltage having a level determined by pull-up based on the positive current and the first feedback current and pull-down based on the negative current and the second feedback current,
   wherein the output voltage corresponds to the feedback output voltage, and
   the input stage controls a bias current so that the bias current has an amount of current non-linearly varying in response to a change in a value of the control data, and outputs the positive current, the first feedback current, the negative current and the second feedback current by using the bias current.

2. The output buffer circuit of claim 1, wherein the decoder
   outputs the control data having more bits than the interpolation data,
   stores mapping information in which values of the interpolation data and values of the control data are mapped, and
   outputs the control data obtained by decoding the interpolation data by using the mapping information.

3. The output buffer circuit of claim 2, wherein the decoder decodes the interpolation data having three bits into the control data having eight bits by using the mapping information.

4. The output buffer circuit of claim 1, wherein the input stage comprises:
   a positive circuit configured to control a positive bias current so that the positive bias current has an amount of current corresponding to the control data in order to compensate for an offset, and to output the positive current and the first feedback current corresponding to one of the first input group comprising the high input voltage and the feedback output voltage and the second input group comprising the low input voltage and the feedback output voltage by using the positive bias current; and
   a negative circuit configured to control a negative bias current so that the negative bias current has the amount of current corresponding to the control data in order to compensate for the offset, and to output the negative current and the second feedback current corresponding to the other of the first input group comprising the high input voltage and the feedback output voltage and the second input group comprising the low input voltage and the feedback output voltage by using the negative bias current.

5. The output buffer circuit of claim 4, wherein the positive circuit comprises:
   a first current supply circuit configured to provide a first positive bias current having an amount of current corresponding to non-inverted control data and a second positive bias current having an amount of current corresponding to inverted control data;
   a first bias unit configured to provide the positive current and the first feedback current corresponding to the high input voltage and the feedback output voltage by using the first positive bias current of the first current supply circuit; and
   a second bias unit configured to provide the positive current and the first feedback current corresponding to the low input voltage and the feedback output voltage by using the second positive bias current of the first current supply circuit.

6. The output buffer circuit of claim 5, wherein the first current supply circuit comprises:
   a plurality of first current sources connected to a ground voltage and set to have identical or different amounts of current;
   a first switching circuit comprising a plurality of first switches configured to correspond to bits of the non-inverted control data, respectively, wherein the plurality of first switches is connected to the plurality of first current sources in a one-to-one way and switched in response to values of the bits of the non-inverted control data, respectively, so that the first positive bias current is provided to the first bias unit; and
   a second switching circuit comprising a plurality of second switches configured to correspond to bits of the inverted control data, respectively, wherein the plurality of second switches is connected to the plurality of first current sources in a one-to-one way and switched in response to values of the bits of the inverted control data, respectively, thereby providing the second positive bias current to the second bias unit.

7. The output buffer circuit of claim 4, wherein the negative circuit comprises:
- a second current supply circuit configured to provide a first negative bias current having an amount of current corresponding to non-inverted control data and a second negative bias current having an amount of current corresponding to inverted control data;
- a third bias unit configured to provide the negative current and the second feedback current corresponding to the high input voltage and the feedback output voltage by using the first negative bias current of the second current supply circuit; and
- a fourth bias unit configured to provide the negative current and the second feedback current corresponding to the low input voltage and the feedback output voltage by using the second negative bias current of the second current supply circuit.

8. The output buffer circuit of claim 7, wherein the second current supply circuit comprises:
- a plurality of second current sources connected to a power source voltage and set to have identical or different amounts of current;
- a third switching circuit comprising a plurality of third switches configured to correspond to bits of the non-inverted control data, respectively, wherein the plurality of third switches is connected to the plurality of second current sources in a one-to-one way and switched in response to values of the bits of the non-inverted control data, respectively, so that the first negative bias current is provided to the third bias unit; and
- a fourth switching circuit comprising a plurality of fourth switches configured to correspond to bits of the inverted control data, respectively, wherein the plurality of fourth switches is connected to the plurality of second current sources in a one-to-one way and switched in response to values of the bits of the inverted control data, respectively, so that the second negative bias current is provided to the fourth bias unit.

9. An output buffer circuit for a display driving apparatus, comprising:
- a decoder configured to receive interpolation data and output control data obtained by decoding the interpolation data; and
- an output circuit configured to generate a bias current having an amount of current non-linearly varying in response to a change in a value of the control data by digital-to-analog conversion for the control data, generate a positive current, a first feedback current, a negative current and a second feedback current corresponding to a high input voltage, a low input voltage and a feedback output voltage by using the bias current, and output an output voltage having a level determined by pull-up based on the positive current and the first feedback current and pull-down based on the negative current and the second feedback current,
- wherein the output voltage corresponds to the feedback output voltage.

10. The output buffer circuit of claim 9, wherein:
- the interpolation data is received to form lower bits of display data and to have values for interpolating a voltage value between the high input voltage and the low input voltage, and
- the control data has more bits than the interpolation data.

11. The output buffer circuit of claim 9, wherein the decoder
- outputs the control data having more bits than the interpolation data,
- stores mapping information in which values of the interpolation data and values of the control data are mapped, and
- outputs the control data obtained by decoding the interpolation data by using the mapping information.

12. The output buffer circuit of claim 11, wherein the decoder decodes the interpolation data having three bits into the control data having eight bits by using the mapping information.

13. The output buffer circuit of claim 9, wherein the output circuit comprises:
- a positive circuit configured to control a positive bias current so that the positive bias current has an amount of current corresponding to the control data, and to generate the positive current and the first feedback current corresponding to one of a first input group comprising the high input voltage and the feedback output voltage and a second input group comprising the low input voltage and the feedback output voltage by using the positive bias current; and
- a negative circuit configured to control a negative bias current so that the negative bias current has the amount of current corresponding to the control data, and to generate the negative current and the second feedback current corresponding to the other of the first input group comprising the high input voltage and the feedback output voltage and the second input group comprising the low input voltage and the feedback output voltage by using the negative bias current.

14. The output buffer circuit of claim 13, wherein the positive circuit comprises:
- a first current supply circuit comprising a plurality of first current sources connected to a ground voltage and set to have identical or different amounts of current, and configured to provide a first positive bias current having an amount of current based on at least some of the plurality of first current sources selected by non-inverted control data and a second positive bias current having an amount of current based on at least some of the plurality of first current sources selected by inverted control data;
- a first bias unit configured to provide the positive current and the first feedback current corresponding to the high input voltage and the feedback output voltage by using the first positive bias current of the first current supply circuit; and
- a second bias unit configured to provide the positive current and the first feedback current corresponding to the low input voltage and the feedback output voltage by using the second positive bias current of the first current supply circuit.

15. The output buffer circuit of claim 13, wherein the negative circuit comprises:
- a second current supply circuit comprising a plurality of second current sources connected to a power source voltage and set to have identical or different amounts of current, and configured to provide a first negative bias current having an amount of current based on at least some of the plurality of second current sources selected by non-inverted control data and a second negative bias current having an amount of current based on at least some of the plurality of second current sources selected by inverted control data;

a third bias unit configured to provide the negative current and the second feedback current corresponding to the high input voltage and the feedback output voltage by using the first negative bias current of the second current supply circuit; and
a fourth bias unit configured to provide the negative current and the second feedback current corresponding to the low input voltage and the feedback output voltage by using the second negative bias current of the second current supply circuit.

* * * * *